(12) United States Patent
Knill et al.

(10) Patent No.: US 12,022,606 B2
(45) Date of Patent: Jun. 25, 2024

(54) POWER SUPPLY APPARATUS

(71) Applicant: TDK-LAMBDA UK LIMITED, Devon (GB)

(72) Inventors: Alex Knill, Devon (GB); Giorgio Ponzo, Bristol (GB); Robin Jeffery, Devon (GB)

(73) Assignee: TDK-Lambda UK Limited, Devon (GB)

( * ) Notice: Subject to any disclaimer, the term of this patent is extended or adjusted under 35 U.S.C. 154(b) by 866 days.

(21) Appl. No.: 17/046,082

(22) PCT Filed: Apr. 4, 2019

(86) PCT No.: PCT/GB2019/050986
§ 371 (c)(1),
(2) Date: Oct. 8, 2020

(87) PCT Pub. No.: WO2019/197804
PCT Pub. Date: Oct. 17, 2019

(65) Prior Publication Data
US 2021/0037638 A1 Feb. 4, 2021

(30) Foreign Application Priority Data
Apr. 9, 2018 (GB) .................................. 1805859

(51) Int. Cl.
*H05K 1/02* (2006.01)
*H05K 3/00* (2006.01)

(52) U.S. Cl.
CPC ......... *H05K 1/0207* (2013.01); *H05K 1/0209* (2013.01); *H05K 3/0061* (2013.01)

(58) Field of Classification Search
None
See application file for complete search history.

(56) References Cited

U.S. PATENT DOCUMENTS 7,952,879 B1 5/2011 Vinciarelli et al.
2008/0296256 A1 12/2008 Panek
(Continued)

OTHER PUBLICATIONS

International Search Report and Written Opinion of the International Searching Authority; International Patent Application No. PCT/GB2019/050986; TDK-Lambda UK Limited; Jul. 29, 2019.

*Primary Examiner* — Bo B Jang
(74) *Attorney, Agent, or Firm* — Gurr Brande & Spendlove, PLLC; Robert D. Spendlove

(57) ABSTRACT

Power supply apparatus (10) comprising a circuit board (11) and one or more power devices (12) attached to a first surface (11a) of the circuit board (11). A plate (14a) composed of a thermally conductive plastic faces the first surface of the circuit board (11). A thermally conductive encapsulant (15) is provided between the first surfaces (11a) of the circuit board (11) and the plate (14a). The circuit board (11) comprises one or more heat-spreading layers (212*,213*) configured to enhance heat transfer in directions parallel to the first surface (11a) of the circuit board (11). The first surface (14aa") of the plate (14a) may also be irregular and comprises one or more first regions (32) and one or more second regions (31) that are further from the first surface (11a) of the circuit board (11) than the one or more first regions (32), with the one or more power devices (12) being aligned with the one or more second regions (31).

9 Claims, 3 Drawing Sheets

(56) References Cited

U.S. PATENT DOCUMENTS

2014/0190930 A1* 7/2014 Mayo ............... H05K 3/284
 264/254
2018/0160525 A1* 6/2018 Satake ............... H05K 7/205

* cited by examiner

POWER SUPPLY APPARATUS

This application is a § 371 National Stage Entry of International Application No. PCT/GB2019/050986 filed Apr. 4, 2019 entitled "Power Supply Apparatus," which application claims priority to GB Application No. 1805859.4 filed Apr. 9, 2018. The entire content of these applications is incorporated herein by reference in its entirety.

The application relates to a power supply apparatus such as a power supply and, in particular, to thermal management in relation to such power supply apparatus.

A power supply can include one or more power devices that generate considerable heat in use. Thermal management can therefore be very important. Several cooling methods can be used—for example, convection cooling, forced-air cooling and/or conduction cooling. A power supply that uses conduction cooling typically has a plate which receives heat from the power device(s) and which is connected, for example, to a heat sink. Such a power supply can be referred to as "baseplate cooled".

Various ways of facilitating baseplate cooling are known. For example, the power device(s) can be mounted on an insulated metal substrate (IMS).

However, insulated metal substrates can have several disadvantages including, for example, relatively high costs, relatively high capacitances, and having only a single layer in which to form a circuit.

Another known way of facilitating baseplate cooling is to use a gap pad to facilitate heat transfer from a power device to the baseplate.

Referring to FIG. 1, a known power supply 1 including a gap pad 6 will now be briefly described. The power supply 1 includes a circuit board 2, a power device 3 on a lower surface 2a of the circuit board 2, and electronic components 4 on an upper surface 2b of the circuit board 2. The power supply 1 includes a metallic baseplate 5. The gap pad 6 is provided between (and in contact with) the power device 3 and the baseplate 5.

However, a gap pad generally only makes contact with the power device and not the circuit board, hence limiting its effectiveness for thermal transfer. Furthermore, gap pads can have relatively high costs—particularly because thick pads and/or additional elements can be needed to maintain suitable clearance distances.

According to a first aspect of the present invention, there is provided a power supply apparatus, comprising: a circuit board; one or more power devices attached to a first surface of the circuit board; a plate at least partly composed of a thermally conductive plastic, wherein a first surface of the plate faces the first surface of the circuit board; and a thermally conductive encapsulant between the first surfaces of the circuit board and the plate; and wherein the circuit board comprises one or more heat-spreading layers configured to enhance heat transfer in directions parallel to the first surface of the circuit board.

Thus, the claimed power supply apparatus can facilitate conductive cooling in an alternative way which can also have several advantages including, for example, lower manufacturing costs, intrinsic electrical insulation, etc. In particular, as the one or more power devices generate heat during operation, the thermally conductive encapsulant acts to dissipate that heat through the encapsulant to the thermally conductive plastic plate. At the same, the heat-spreading layers in the circuit board act to spread the heat from the power devices laterally across the first surface of the circuit board. This effectively increases the surface area for heat transfer away from the circuit board through the encapsulant. In this case of such power supply apparatus, this thereby provides a synergistic cooling effect, allowing power devices to more effectively dissipate the heat generated during their operation.

The encapsulant may have a thermal conductivity of between about 0.5 and 2 $Wm^{-1}K^{-1}$.

The plastic may be at least partly composed of a polymer and a thermally-conductive additive.

The plastic may have a thermal conductivity of, for example, between about 1 and 10 $Wm^{-1}K^{-1}$.

One or more of the heat-spreading layers may comprise copper.

One or more of the heat-spreading layers may be thicker than the conductive layers of a conventional printed circuit board. For example, a heat-spreading layer may have a thickness of 35, 70, 105, 140, 175, or 210 μm. This can be achieved without unduly large increases in costs.

One or more of the heat-spreading layers may be at least substantially unpatterned. Thus, the (average) cross-sectional area, and hence the heat-spreading ability of such layers, can be increased.

The circuit board may be a multi-layer printed circuit board comprising one or more inner layers and a first outer layer proximate to the first surface of the circuit board. The one or more inner layers may include the one or more heat-spreading layers. A separation between the first outer layer and a nearest one of the heat-spreading layers may be no more than 150 micrometres. These features may each allow heat to be more effectively transferred from the one or more power devices to the one or more heat-spreading layers.

The circuit board may comprise a first outer layer proximate to the first surface of the circuit board. The first outer layer may comprise one or more copper floods (i.e. areas filled with copper) in a vicinity of one or more of the power devices. Thus, heat transfer from the electronic devices to the encapsulant can be further enhanced.

The first surface of the plate may be irregular and comprise one or more first regions and one or more second regions that are further from the first surface of the circuit board than the one or more first regions, and where the one or more power devices are at least partly aligned with the one or more second regions. In embodiments, a distance between at least one of the one or more first regions and the first surface of the circuit board is less than a height of at least one of the one or more power devices. In embodiments, a distance between the first surface of the plate and either the first surface of the circuit board or a power device attached thereto is no more than 1 millimetre over substantially all of the first surface of the circuit board.

With the above embodiments, the profiled shape of the plate comprises formations that may correspond to the profile of one or more of the electronic components, such as the power devices, on the circuit board. As such, once the apparatus is assembled, the opposing surface profiles of the plate and the circuit board (with its electronic components) may effectively mate together, leaving a small space between the opposing surfaces. This allows the plate to enclose the circuit board, whilst minimising the quantity of thermally conductive encapsulant required to fill the space between the surfaces. Not only does this reduce costs, but the minimised distance between the circuit board and the plate significantly improves the thermal conductance, for example, by a factor of 2-5. As such, the apparatus can be used in relatively high power applications.

The plate may correspond to at least part of a base of an enclosure. The enclosure may comprise sidewalls extending from the first surface of the plate toward the first surface of the circuit board. Thus, the apparatus can be easily manufactured and/or provide enhanced durability. In embodiments, the enclosure may correspond to a potting box.

In embodiments, the enclosure may further comprise one or more sidewall formations projecting laterally inward. The locations of the sidewall formations may align with regions of the circuit board where device components are not present. As such, the sidewall formations essentially act to reduce the surface area of the first surface of the plate, such that the volume of encapsulant required to fill the space between the plate and the circuit board is minimised. Therefore, this helps to minimise the costs associated with the encapsulant material. At the same time, encapsulant material is still provided in regions surrounding the electronic components to optimise heat dissipation.

According to a further aspect of the invention, there is provided a power supply apparatus, comprising a circuit board; one or more power devices attached to a first surface of the circuit board; a plate at least partly composed of a thermally conductive plastic, wherein a first surface of the plate faces the first surface of the circuit board; and a thermally conductive encapsulant between the first surfaces of the circuit board and the plate; and wherein the first surface of the plate is irregular and comprises one or more first regions and one or more second regions that are further from the first surface of the circuit board than the one or more first regions, and wherein the one or more power devices are at least partly aligned with the one or more second regions.

Thus, the claimed power supply apparatus can facilitate conductive cooling in an alternative way which can also have several advantages including, for example, lower manufacturing costs, intrinsic electrical insulation, etc. In particular, as the one or more power devices generate heat during operation, the thermally conductive encapsulant acts to dissipate that heat through the encapsulant to the thermally conductive plastic plate. At the same, the profiled shape of the plate comprises formations that may correspond to the profile of one or more of the electronic components, such as the power devices, on the circuit board. As such, once the apparatus is assembled, the opposing surface profiles of the plate and the circuit board (with its electronic components) may effectively mate together, leaving a small space between the opposing surfaces. This allows the plate to enclose the circuit board, whilst minimising the quantity of thermally conductive encapsulant required to fill the space between the surfaces. Not only does this reduce costs, but the minimised distance between the circuit board and the plate significantly improves the thermal conductance, for example, by a factor of 2-5. As such, the apparatus can be used in relatively high power applications.

Certain embodiments of the present invention will now be described, by way of example, with reference to the accompanying drawings, in which.

Figure 1:
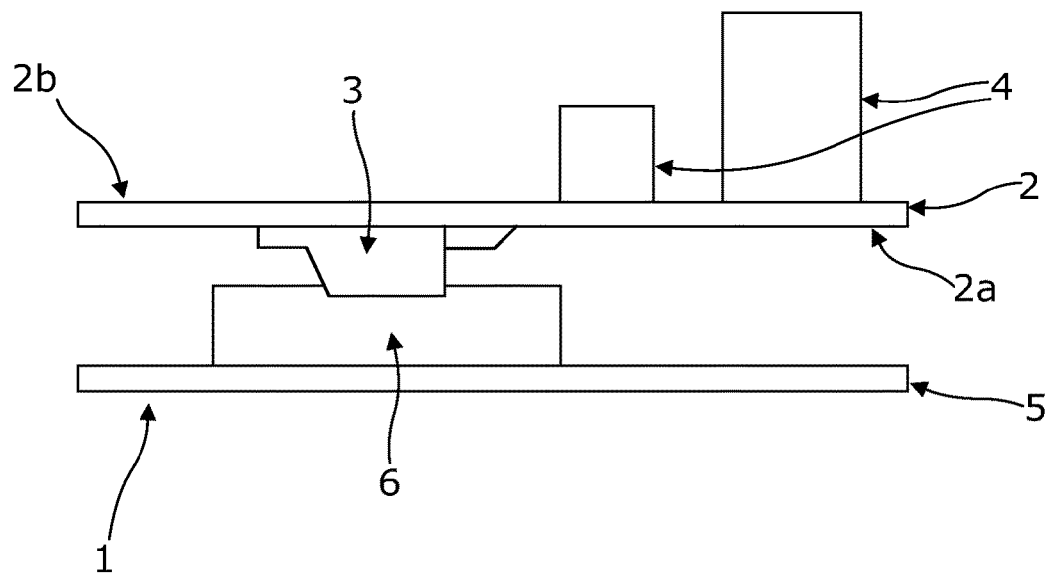
FIG. 1 is a schematic cross-sectional view of a known power supply including a gap pad.
Figure 2:
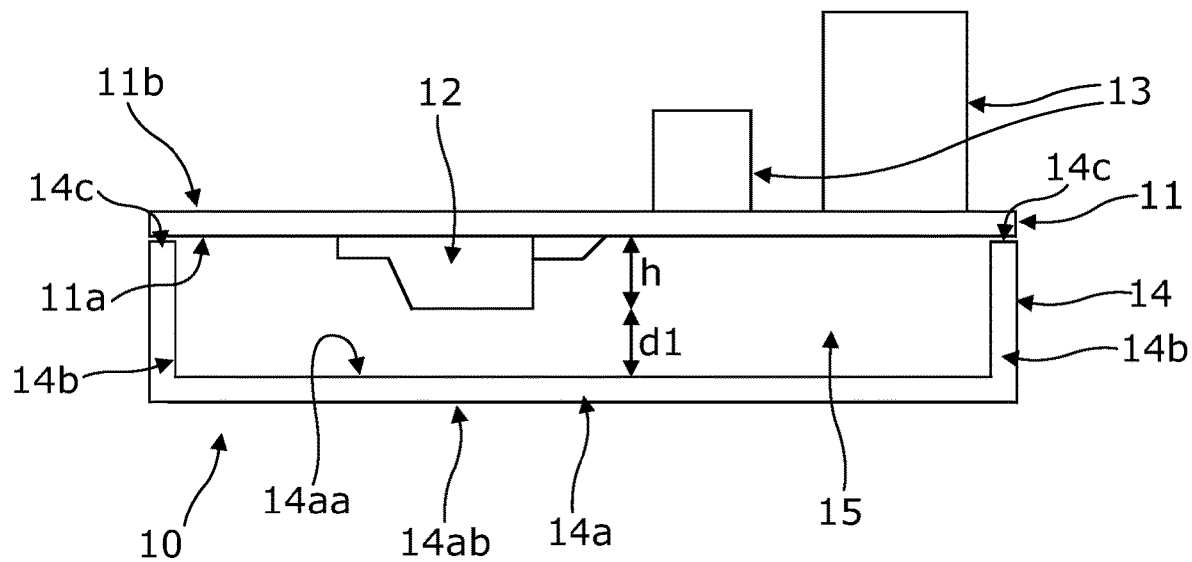
FIG. 2 is a schematic cross-sectional view of a first example of a power supply.

Referring to FIG. 2, a first example of a power supply 10 will now be described.

The power supply 10 includes a circuit board 11. The circuit board 11 may correspond to a conventional printed circuit board. For example, the circuit board 11 may have an FR-4 glass epoxy substrate. The circuit board 11 has a first major surface 11*a* (hereinafter referred to as a lower surface) and a second major surface 11*b* (hereinafter referred to as an upper surface, although it will be appreciated that the power supply 10 may have any suitable orientation).

A power device 12 is attached to the lower surface 11*a* of the circuit board 11. In this example, there is only one power device 12. However, there may be multiple power devices 12. The power device 12 may be a power diode, a thyristor, a power MOSFET (metal-oxide-semiconductor field-effect transistor), an IGBT (insulated-gate bipolar transistor) or any other type of power device. The power device 12 may be surface-mounted on the circuit board 11. There may also be other electronic components attached to the lower surface 11*a* of the circuit board 11.

Other electronic components 13 are attached to the upper surface 11*b* of the circuit board 11. In this example, there are two components 13, although there may be any number of components 13. The components 13 may be leaded components. The components 13 may be of any suitable type—including, in principle, power devices. In some examples, there may not be any components attached to the upper surface 11*b* of the circuit board 11.

The power supply 10 also includes an enclosure 14. The enclosure 14 may correspond to a potting box. The enclosure 14 includes a base 14*a*, which, in this example, is substantially rectangular. Accordingly, the enclosure includes four side walls 14*b*, two of which are visible in the figure. The base 14*a* has an interior surface 14*aa* (hereinafter referred to as an upper surface) and an exterior surface 14*ab* (hereinafter referred to as a lower surface).

The circuit board 11 is arranged relative to the enclosure 14 such that the lower surface 11*a* of the circuit board 11 faces the upper surface 14*aa* of the base 14*a* of the enclosure 14. The surfaces 11*a*, 14*aa* may be substantially parallel with each other and may be separated by a distance equal to a height h of the power device 12 plus a clearance $d_1$. The clearance $d_1$ is preferably as low as possible in view of the mechanical tolerances of, for example, the power device 12 and the enclosure 14. The clearance $d_1$ may be, for example, between 1 and 10 millimetres.

In this example, the side walls 14*b* of the enclosure 14 have upper surfaces which form a rim 14*c* and the rim 14*c* supports the lower surface 11*a* of the circuit board 11. The power supply 10 may include suitable means for securing the circuit board 11 and the enclosure 14 to each other.

The enclosure 14 is at least partly composed of a thermally-conductive plastic. The plastic is typically at least partly composed of a polymer and a thermally-conductive additive. The plastic is electrically insulating.

The enclosure 14 may be manufactured in any suitable way, for example by injection moulding. The enclosure 14 may be a single part or may be made of several parts. In some examples, the base 14*a* may be made separately from, and/or from a different material from, the remainder of the enclosure 14. In such examples, only the base 14*a* may include the thermally-conductive plastic.

The power supply 10 also includes a thermally-conductive encapsulant 15. The encapsulant 15 is arranged between the lower surface 11a of the circuit board and the upper surface 14aa of the base 14a of the enclosure 14. The encapsulant 15 preferably fills substantially all of the empty space between the two surfaces 11a, 14aa. The encapsulant 15 is preferably in contact with substantially all of the surfaces bounding this empty space, i.e. exposed parts of the lower surface 11a of the circuit board 11, exposed surfaces of the power device 12, the upper surface 14aa of the base 14a and interior surfaces of the side walls 14b of the enclosure 14.

The encapsulant 15 may be a thermally-enhanced silicone encapsulant with a thermal conductivity of about 0.8 $Wm^{-1}K^{-1}$. The encapsulant 15 is electrically insulating.

In use, the power supply 10 is typically arranged such that the lower surface 14ab of the base 14a of the enclosure 14 is in thermal contact with a surface of a heat sink, cold plate or the like (hereinafter assumed to be a heat sink). Accordingly, heat generated by the power device may be conducted from the power device 12 via the encapsulant 15 and the base 14 to the heat sink. Heat is conducted from the power device 12 directly to the encapsulant 15 and indirectly via the circuit board 11 to the encapsulant 15. Heat generated by any other electronic devices attached to the circuit board 11 may be conducted to the heat sink in a similar way.

Thus, the power supply 10 can conductively cool the power device 12 in an effective way with relatively low-cost components—for example, the circuit board 11, the enclosure 14 and/or the encapsulant 15.

Figure 3:
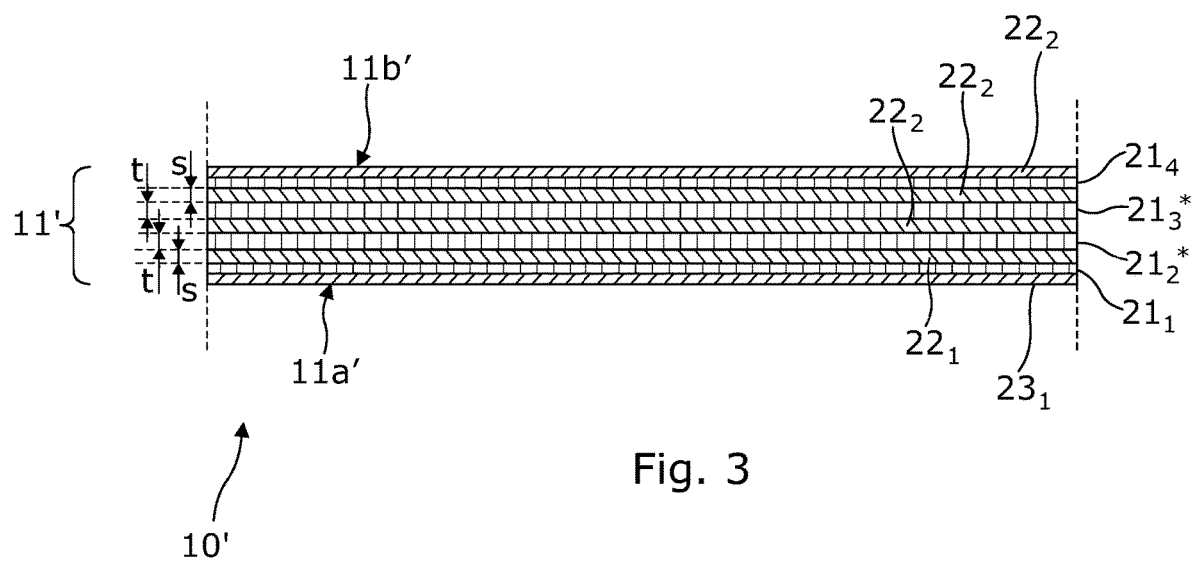
FIG. 3 is a schematic cross-sectional view of a part of a printed circuit board used in a second example of a power supply.

Referring to FIGS. 2 and 3, a second example of a power supply 10' will now be described.

The power supply 10' is the same as the first example of the power supply 10 (as illustrated in FIG. 2) but with a specifically designed circuit board 11' (a part of which is illustrated in FIG. 3).

Similarly to the first example, the circuit board 11' has a lower surface 11a' (to which the power device 12 is attached) and an upper surface 11b' (to which the components 13 are attached).

In this example, the circuit board 11' is a multi-layer printed circuit board and includes several conductive layers 21. The conductive layers 21 are typically composed of copper. In this example, there are four conductive layers $21_1$-$21_4$, although there may be any suitable number of conductive layers 21. The two outermost conductive layers $21_1$, $21_4$ are hereinafter referred to as outer layers. The other conductive layers $21_2$*, $21_3$* are hereinafter referred to as inner layers. The circuit board 11' includes a substrate layer 22 between each pair of conductive layers 21 and a coating layer 23 on the outermost surface of each of the outer layers 21. The substrate layers 22 may be composed of FR-4 glass epoxy.

One or more inner layers $21_2$*, $21_3$* (hereinafter referred to as heat-spreading layers) are adapted to enhance heat transfer in directions parallel to the lower surface 11a' of the circuit board 11'. In this example, all of the inner layers $21_2$*, $21_3$* correspond to heat-spreading layers, although this need not be the case.

The inner layers $21_2$*, $21_3$*, particularly the inner layer(s) $21_2$* closer to the lower surface 11a', are configured to include no (or relatively few) patterns or circuit tracks, thus forming a (substantially) solid copper sheet, which can maximise the heat spreading effect.

The conductive layers 21 need not all have the same thickness. The heat-spreading layers $21_2$*, $21_3$* can be conveniently adapted to be thicker than the outer layers $21_1$, $21_4$ to enhance the heat spreading effect. Each of the heat spreading layers $21_2$*, $21_3$* may have a thickness of, for example, between about 35 μm (1 oz copper) and 210 μm (6 oz copper).

As will be appreciated, the circuit board 11' may be made using conventional techniques, except with thicker foils being used to form the heat-spreading layers $21_2$*, $21_3$*. Hence the additional costs are relatively low.

The heat-spreading layers $21_2$*, $21_3$* are preferably relatively close to the lowermost outer layer $21_1$. This allows heat to be more effectively transferred from the power device 12 via the substrate layers $22_1$, $22_2$ to the heat-spreading layers $21_2$*, $21_3$*. In this example, a separation s between the lowermost heat-spreading layer $21_2$* and the lowermost outer layer $21_1$ is about 150 micrometres. In other examples, the separation s may be different.

Thus, due to the heat-spreading layers $21_2$*, $21_3$*, heat generated by the power device 12 is more effectively distributed through the circuit board 11', thereby increasing an effective contact area with the encapsulant 15 and hence increasing a thermal conductance between the circuit board 11' and the encapsulant 15.

Figure 4:
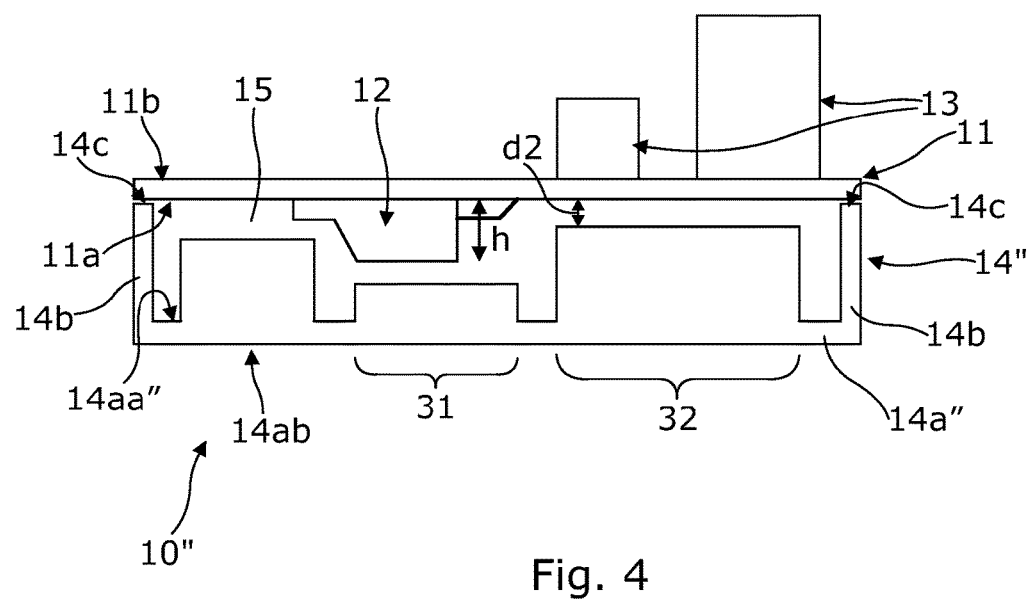
FIG. 4 is a schematic cross-sectional view of a third example of a power supply.

Referring to FIG. 4, a third example of a power supply 10" will now be described.

The power supply 10" is the same as the first example of the power supply 10 or the second example of the power supply 10', but has an enclosure 14" with a base 14a" with an irregular upper surface 14aa".

The upper surface 14aa" has a shape which may broadly match the shape (profile) of the combination of the lower surface 11a of the circuit board 11, the power device 12, and any other electronic components attached to the lower surface 11a of the circuit board 11.

In this example, the upper surface 14aa" has several regions, each of which is parallel to the lower surface 11a of the circuit board 11 and is separated therefrom by a particular distance. In other examples, the surfaces 11a, 14aa" need not be parallel.

For example, the upper surface 14aa" has a region 31 (hereinafter referred to as a lowered region) which is relatively far from the lower surface 11a of the circuit board 11 and which is at least partly aligned with the power device 12. The upper surface 14aa" has another region 32 (hereinafter referred to as a raised region) which is relatively close to the lower surface 11a of the circuit board 11 and is at least partly aligned with a region of the lower surface 11a of the circuit board 11 to which no electronic components are attached. It can be seen from the figure that, in the raised region 32, the distance d2 between the two surfaces 11a, 14aa" is less than the height h of the power device 12.

In this example, the distance between the upper surface 14aa" of the base 14a" of the enclosure 14" and the lower surface 11a of the circuit board 11 or, if present, the power device 12 or another electronic component is ≤1 mm over substantially all (e.g. 90%) of the lower surface 11a of the circuit board 11.

The plastic used for the enclosure 14" may have a considerably higher thermal conductivity than the encapsulant (e.g. ~5 $Wm^{-1}K^{-1}$ compared with ~1 $Wm^{-1}K^{-1}$). Thus, by increasing the volume of plastic relative to the volume of encapsulant 15, the thermal conductance between the circuit board 11 and, for example, the lower surface 14ab of the base 14a" of the enclosure 14" can be considerably increased. Moreover, the cost per unit mass of the plastic is generally lower than the encapsulant 15, and so increasing the amount of plastic relative to the amount of encapsulant 15 can help reduce overall costs.

Figure 5:
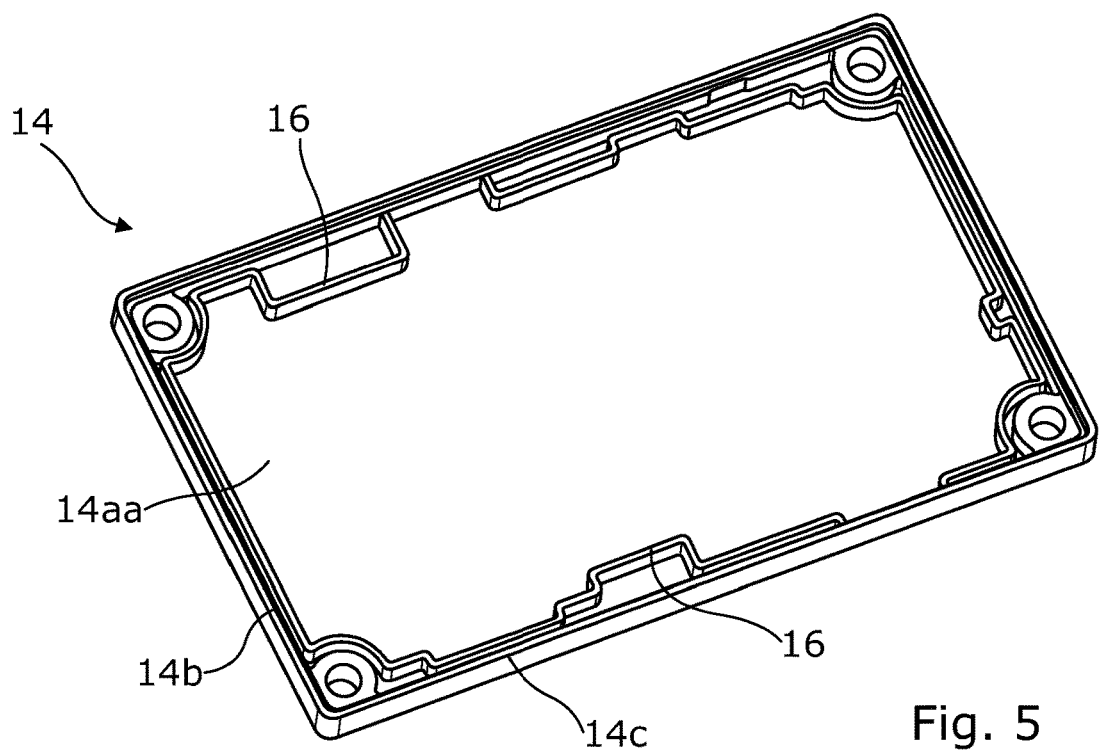
FIG. 5 is a isometric view of an enclosure for a fourth example of a power supply.
Figure 6:
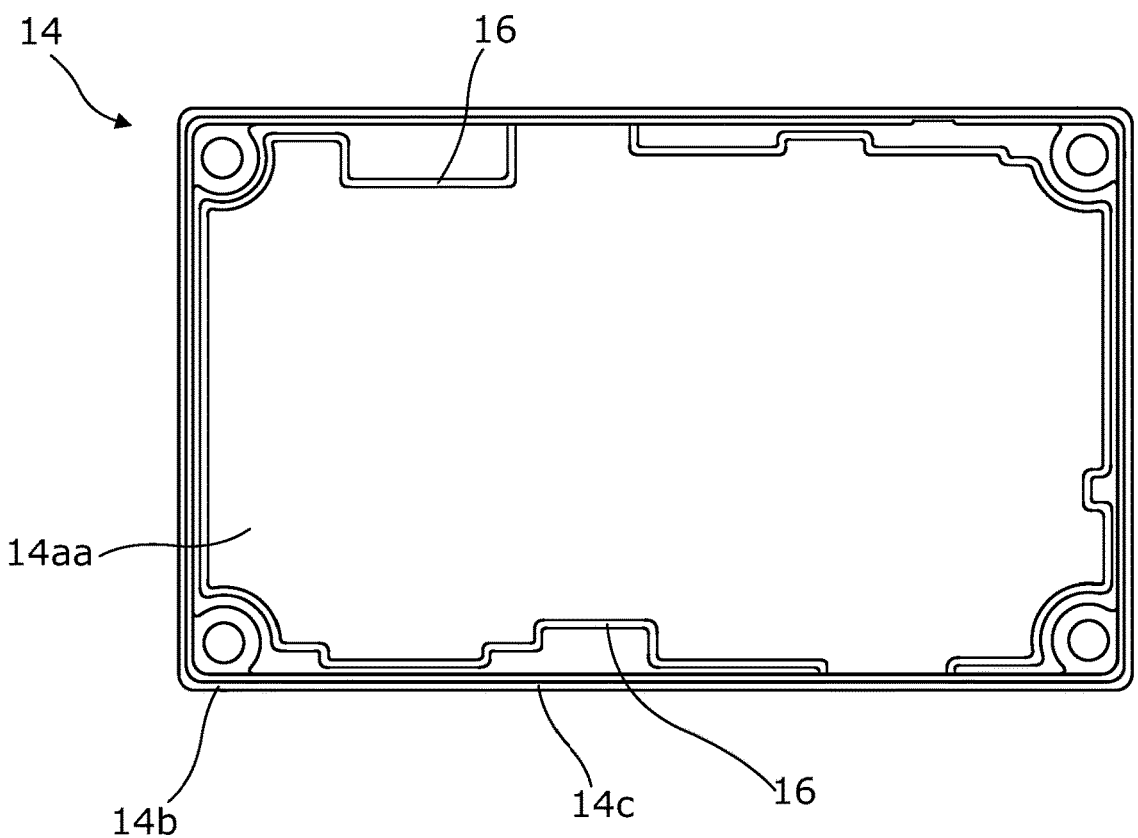
FIG. 6 is a plan view of the enclosure shown in FIG. 5.

FIGS. 5 and 6 respectively show isometric and plan views of an enclosure 14 used in a power supply apparatus according to a fourth embodiment of the invention. The electronic circuitry is the same as the first, second and third examples above, but the enclosure 14 is provided with a plurality of sidewall formations 16 which project internally from the sidewalls 14b to minimise the effective surface area or footprint of the upper surface 14aa of the base.

The sidewall formations 16 function as dams for localising the position of the encapsulant 15 which fills the space between the upper surface 14aa of the enclosure 14 and the lower surface 11a of the circuit board 11. That is, the sidewall formations 16 have a lateral profile which may substantially correspond to the lateral profile of any electronic components, including the power device 12, fitted to the lower surface 11a of the circuit board 11. As such, the sidewall formations 16 act to reduce the volume of encapsulant 15 required to fill the space between the enclosure 14 and the circuit board, and thereby minimise costs associated with the encapsulant material. At the same time, encapsulant material is still provided in regions surrounding the electronic components to optimise heat dissipation.

It will be appreciated that there may be many other variations of the above described examples.

The circuit board 11' may have a lowermost outer layer 21$_1$ having one or more copper floods in a vicinity of the power device 12, thereby enhancing heat transfer from the power device 12 to the encapsulant 15.

The apparatus described above need not be a power supply. Instead of a power device, the apparatus may include a different type of electronic component.

Instead of a printed circuit board, the power supply may include a different type of support or substrate.

The enclosure may have a different shape.

Instead of an enclosure, the power supply may include a plate. The plate may correspond to the base of the enclosure of any of the abovedescribed examples. In other words, the side walls may be omitted. The plate may form part of another element of the power supply such as a chassis.

The power supply may include other cooling mechanisms such as a forced-air cooling mechanism.

What is claimed is:

1. A power supply apparatus, comprising:
   a multi-layer circuit board having a printed circuit board layer on a lower surface and a printed circuit board layer on an upper surface;
   one or more power devices attached to the printed circuit board layer on the lower surface of the multi-layer circuit board;
   electronic components attached to the printed circuit board layer on the upper surface of the multi-layer circuit board;
   a thermally conductive plate at least partly composed of a thermally conductive plastic, wherein an upper surface of the plate faces the printed circuit board layer on the lower surface of the multi-layer circuit board; and
   a thermally conductive encapsulant provided to fill substantially all of the empty space between the printed circuit board layer on the lower surface of the multi-layer circuit board and the one or more power devices attached thereto and the upper surface of the thermally conductive plate to dissipate heat through the encapsulant to the thermally conducive plate; and
   wherein the multi-layer circuit board further comprises a thermally conductive heat-spreading layer which is located no more than 150 micrometres from the printed circuit board layer on the lower surface of the multi-layer circuit board and which is thicker than that printed circuit board layer whereby the heat from the one or more power devices attached to that printed circuit board layer is spread across the multi-layer circuit board to dissipate through that printed circuit board layer and into the thermally conductive encapsulant.

2. Apparatus according to claim 1 wherein the encapsulant has a thermal conductivity of between about 0.5 and 2 $Wm^{-1}K^{-1}$.

3. Apparatus according to claim 1 wherein the thermally conductive plastic is at least partly composed of a polymer and a thermally-conductive additive.

4. Apparatus according to claim 1 wherein the thermally conductive plastic has a thermal conductivity of between about 1 and 10 $Wm^{-1}K^{-1}$.

5. Apparatus according to claim 1, wherein the multi-layer circuit board further comprises a thermally conductive heat-spreading layer which is located no more than 150 micrometres from the printed circuit board layer on the upper surface of the multi-layer circuit board and which is thicker than that printed circuit board layer whereby the heat from the electronic components attached to that printed circuit board layer is spread across the multi-layer circuit board to dissipate there through and into the thermally conductive encapsulant.

6. Apparatus according to claim 1 wherein the printed circuit board layer on the lower surface of the multi-layer circuit board comprises one or more copper floods in a vicinity of the one or more of the power devices.

7. Apparatus according to claim 1 wherein the thermally conductive plate corresponds to a base of an enclosure having sidewalls extending from the first upper surface of the thermally conductive plate to a rim which supports the multi-layer circuit board.

8. Apparatus according to claim 1 wherein the upper surface of the thermally conductive plate and a profile of the one or more power devices attached to the printed circuit board layer on the lower surface of the multi-layer circuit board match together.

9. Apparatus according to claim 8 wherein a distance between the upper surface of the thermally conductive plate and a profile of the one or more power devices attached to the printed circuit board layer on the lower surface of the multi-layer circuit board is no more than 1 millimetre over substantially all of the lower surface of the multi-layer circuit board.

* * * * *